(12) United States Patent
Brook et al.

(10) Patent No.: US 11,406,012 B2
(45) Date of Patent: Aug. 2, 2022

(54) TRANSFER INCLUDING AN ELECTRICAL COMPONENT

(71) Applicant: CONDUCTIVE TRANSFERS LIMITED, Barnsley (GB)

(72) Inventors: Paul Timothy Brook, Barnsley (GB); Raymond Bungay, Poole (GB); Mark John Catchpole, Ely (GB); Melvyn Revitt, Sheffield (GB); Steven Paul Sutcliffe, Doncaster (GB)

(73) Assignee: Conductive Transfers Limited, Hoyland Barnsley (GB)

( * ) Notice: Subject to any disclaimer, the term of this patent is extended or adjusted under 35 U.S.C. 154(b) by 0 days.

(21) Appl. No.: 17/277,959

(22) PCT Filed: Sep. 13, 2019

(86) PCT No.: PCT/GB2019/000137
§ 371 (c)(1),
(2) Date: Mar. 19, 2021

(87) PCT Pub. No.: WO2020/058660
PCT Pub. Date: Mar. 26, 2020

(65) Prior Publication Data
US 2021/0360784 A1    Nov. 18, 2021

(30) Foreign Application Priority Data
Sep. 19, 2018   (GB) .................................. 18 15 292.6

(51) Int. Cl.
*H05K 1/11*   (2006.01)
*H05K 3/38*   (2006.01)
(Continued)

(52) U.S. Cl.
CPC ............... *H05K 1/038* (2013.01); *H05K 1/11* (2013.01); *H05K 1/186* (2013.01); *H05K 3/046* (2013.01);
(Continued)

(58) Field of Classification Search
CPC .......... H05K 1/038; H05K 1/11; H05K 1/144; H05K 3/38; H05K 3/386; H05K 3/387
See application file for complete search history.

(56) References Cited

U.S. PATENT DOCUMENTS

2007/0134849 A1   6/2007   Vanfleteren et al.
2016/0192474 A1   6/2016   Niskala et al.
(Continued)

FOREIGN PATENT DOCUMENTS

| EP | 3364728 A1 | 8/2018 |
| GB | 2555592 A | 5/2018 |
| WO | 2015066462 A1 | 5/2015 |

OTHER PUBLICATIONS

Corresponding International Application No. PCT/GB2019/000137, International Search Report and Written Opinion, dated Jan. 7, 2020.
(Continued)

*Primary Examiner* — Jeremy C Norris
(74) *Attorney, Agent, or Firm* — Cooper Legal Group LLC

(57) ABSTRACT

A conductive transfer and method of producing the conductive transfer is described. The conductive transfer comprises two non-conductive layers and a conductive layer between the two non-conductive layers and at least one electrical component in electrical communication with the conductive layer. The conductive layer includes a power trace for
(Continued)

providing a power source to the electrical component and a data trace for providing the electrical component with an electrical signal.

20 Claims, 10 Drawing Sheets

(51) Int. Cl.
*H05K 1/03* (2006.01)
*H05K 1/18* (2006.01)
*H05K 3/04* (2006.01)
*H05K 3/30* (2006.01)
*A41D 1/00* (2018.01)

(52) U.S. Cl.
CPC ............. *H05K 3/305* (2013.01); *A41D 1/002* (2013.01); *H05K 2201/10106* (2013.01); *H05K 2201/10151* (2013.01)

(56) References Cited

U.S. PATENT DOCUMENTS

2018/0117895 A1   5/2018   Brook et al.
2018/0220534 A1   8/2018   Heikkinen et al.

OTHER PUBLICATIONS

Corresponding International Application No. PCT/GB2019/000093, International Preliminary Report on Patentability, dated Jan. 14, 2021.

TRANSFER INCLUDING AN ELECTRICAL COMPONENT

CROSS REFERENCE TO RELATED APPLICATIONS

This application claims priority from United Kingdom Patent Application number 18 15 292.6, filed on 19 Sep. 2018, the whole contents of which are incorporated herein by reference.

BACKGROUND OF THE INVENTION

The present invention relates to a conductive transfer and a method of producing a conductive transfer.

Conductive transfers such as that disclosed by the applicant in patent publication GB 2 555 592 provide a means by which thin, lightweight, washable and stretchable conductive elements can be incorporated into flexible items, for example, wearable items such as items of clothing.

Printed circuit boards (PCBs) are also known in the art as providing suitable circuits by surface mount technology which can provide complex functionality including electronic components and are utilized in electronic devices to provide such functionality.

Combining electronic components having functionality into wearable items is traditionally problematic, and this is typically solved by providing a removable component that does not need to be thin, lightweight, washable or flexible. Such devices can be cumbersome or suffer loss of functionality when incorporated into wearable items such as clothing.

BRIEF SUMMARY OF THE INVENTION

According to an aspect of the present invention, there is provided a conductive transfer in accordance with claim 1.

According to a second aspect of the present invention, there is provided a method of producing a conductive transfer in accordance with claims 17.

In an embodiment, a further step of curing the bonding material is performed after the at least one electrical component has been placed. The bonding material may be any suitable conductive adhesive or a solder paste. When a solder paste is utilized, the conductive transfer is cured in a reflow oven so as to melt the solder paste, which then solidifies on cooling.

The steps of printing each of the layers involve printing the layer onto a substrate or transfer film, and, following completion, the conductive transfer can be transferred or applied to a suitable surface or article typically by means of application of heat and/or pressure.

Embodiments of the invention will be described, by way of example only, with reference to the accompanying drawings. The detailed embodiments show the best mode known to the inventor and provide support for the invention as claimed. However, they are only exemplary and should not be used to interpret or limit the scope of the claims. Their purpose is to provide a teaching to those skilled in the art. Components and processes distinguished by ordinal phrases such as "first" and "second" do not necessarily define an order or ranking of any sort.

DETAILED DESCRIPTION OF EMBODIMENTS OF THE INVENTION

FIG. 1

Figure 1:
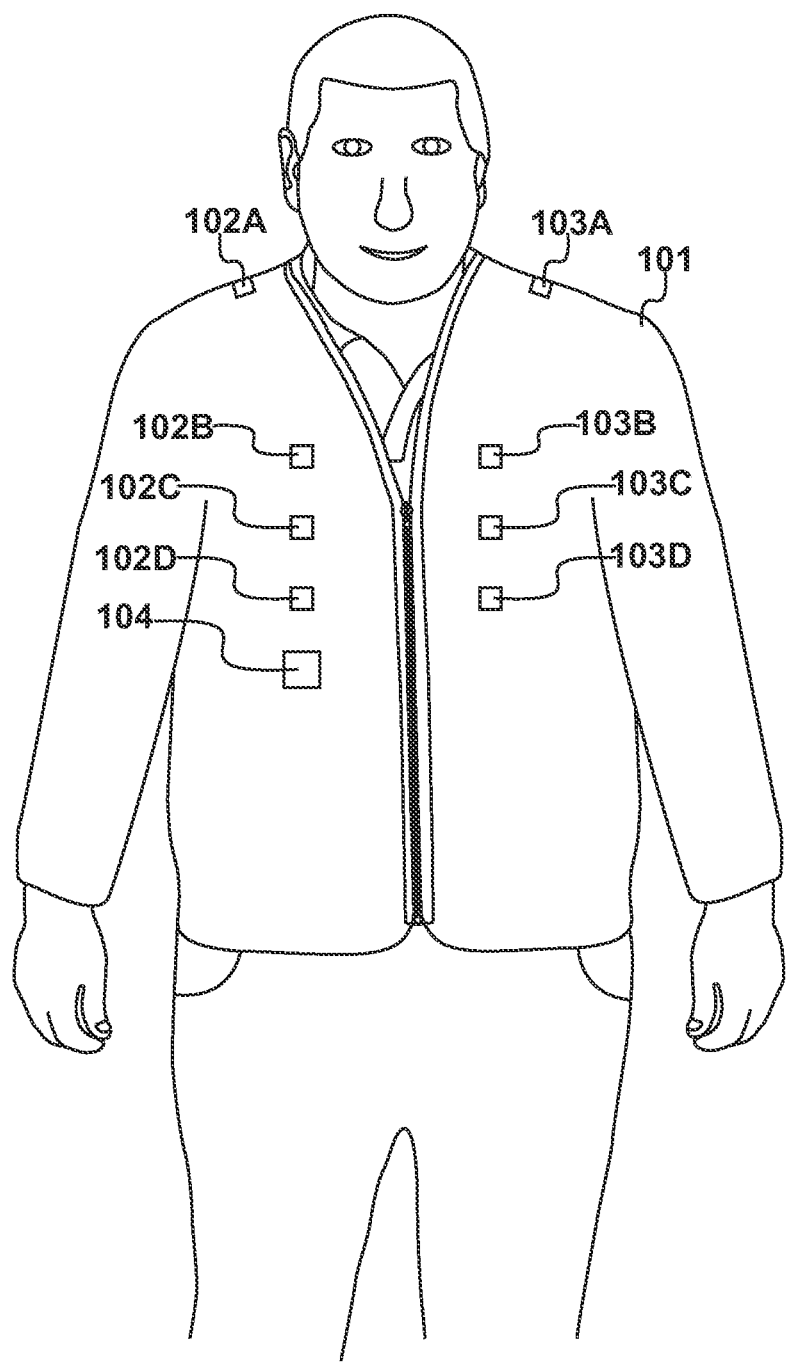
FIG. 1 shows a conductive transfer in accordance with the present invention incorporated into a wearable item.

A conductive transfer according to the present invention is configured to be incorporated into a wearable item. In the example of FIG. 1, a wearable item incorporating a conductive transfer in accordance with the present invention is shown and described.

Wearable item 101, in this example illustrated as a jacket, such as a hi-vis jacket, comprises a conductive transfer having an electrical component in electrical communication with a conductive layer of the conductive transfer.

As the conductive transfer is incorporated into wearable item 101, wearable item 101 appears functionally similar to a conventional jacket. However, wearable item 101 comprises a plurality of electrical components 102 and 103 which in this case are a plurality of illuminating devices, for example, light-emitting diodes (LEDs). Each plurality of electrical components 102 and 103 are associated with a conductive transfer incorporated into jacket 101 in accordance with the present invention. The conductive transfer is in electrical communication with a driving controller 104 which is incorporated into the wearable item and is configured to provide power and suitable signals to the conductive transfers, and consequently, each of the electrical components. It is appreciated that driving controller 104 may be hidden internally in jacket 101 rather than being externally visible.

It is appreciated that wearable item 101 can be any suitable wearable item other than a jacket, for example, a pair of shorts, vest, hat or other wearable item. Furthermore, it is anticipated that the conductive transfer as described herein may be incorporated into any other suitable article or device. For example, a conductive transfer as described herein may form part of a larger electronic device comprising several components including the conductive transfer.

In an alternative embodiment to that of FIG. 1, the electrical component comprises a sensing device which is configured to measure a required parameter. For example, the sensing device may be configured to measure temperature, heat flow, light, sound, touch, biomedical data, physiological data, environmental conditions or electromagnetic waves. In one embodiment, a sensing device configured to measure environmental conditions involves measuring pollutants or gasses such as carbon monoxide so as to provide an alert to a user. In a further embodiment, the electrical component is configured to provide stimulation and is incorporated into a wearable item so as to provide stimulation to the wearer for medical purposes for example.

Additionally, it is appreciated that the electrical component or plurality of electrical components can be any suitable component which is able to receive a power source and/or electrical signal from a conductive layer of the conductive transfer. Suitable electrical components and applications include, but are not limited to, any of the following: a single-board computer (SBC); a printed circuit board (PCB); a flexi-circuit; a system-on-chip (SOC); volatile memory; dynamic random-access memory (DRAM); non-volatile memory; flash memory; microprocessors; multi-processors; microcontrollers; parallel processors; a digital signal processor (DSP); a graphics processing unit (GPU); display controller; neural processor; speech recognition processor; key phrase recognition chip; accelerator; radio frequency integrated circuits (RFIC); modem; mobile RFIC; mobile communications radio frequency (RF) front end SOC; microwave integrated circuit (IC); wireless enabled IC; wireless LAN IC; Bluetooth® SOC; low-power wide-area network (LPWAN) SoC; Zigbee® SOC; long range (LORA) SOC; Sigfox® SOC; internet of things (IOT) communications SOC; amplifier; power amplifier; touch sensor; touch controller; haptic device; switch; button switch; slide switch; power management IC; digital-to-analogue converter (DAC); analogue-to-digital converter (ADC); battery management IC; wireless charging IC; LED; micro-LED; audio codec; speaker; microphone; display; inorganic LED display; organic LED display; liquid crystal display (LCD); electrophoretic display; micro LED display; light sensor; electro-muscular stimulation (EMS) IC; transcutaneous electrical nerve stimulation (TENS) IC; gas sensor; gas detector; air particle sensor; temperature sensor; heat flux sensor; proximity sensor; ultrasound transmitter; ultrasound sensor; ultrasound communications IC; radio frequency identification (RFID); near-field communication (NFC); physiological sensor; drug dispenser; medical actuator; medical sensor; sweat sensor; sweat analysis IC; optical heart rate sensor; blood pressure sensor; breathing rate sensor; heater; cooling device; Peltier thermoelectric cooling device; thermopile; bolometer; infra-red sensor; infra-red transmitter; serial communication IC; SPI IC; I2C IC; battery; primary battery; secondary battery; lithium-ion battery; lithium polymer battery; transducer; solar panel; polymer electrode, for example, as available from IDUN Technologies, Switzerland; pressure sensor; polyvinylidene fluoride (PVDF) pressure sensor; piezoelectric sensor; piezoelectric generator; blood analysis device; skin resistance measurement device.

Electrical components in accordance with the invention, notwithstanding the examples listed above, may also be printed components. Examples include, but are not limited to, resistors, capacitors, transistors, cooling elements including Peltier coolers, sensors for determining touch, pressure, light, heat flux or temperature. In some embodiments, the conductive transfer may include a combination of both printed electrical components and physical electrical components.

FIG. 2

Figure 2:
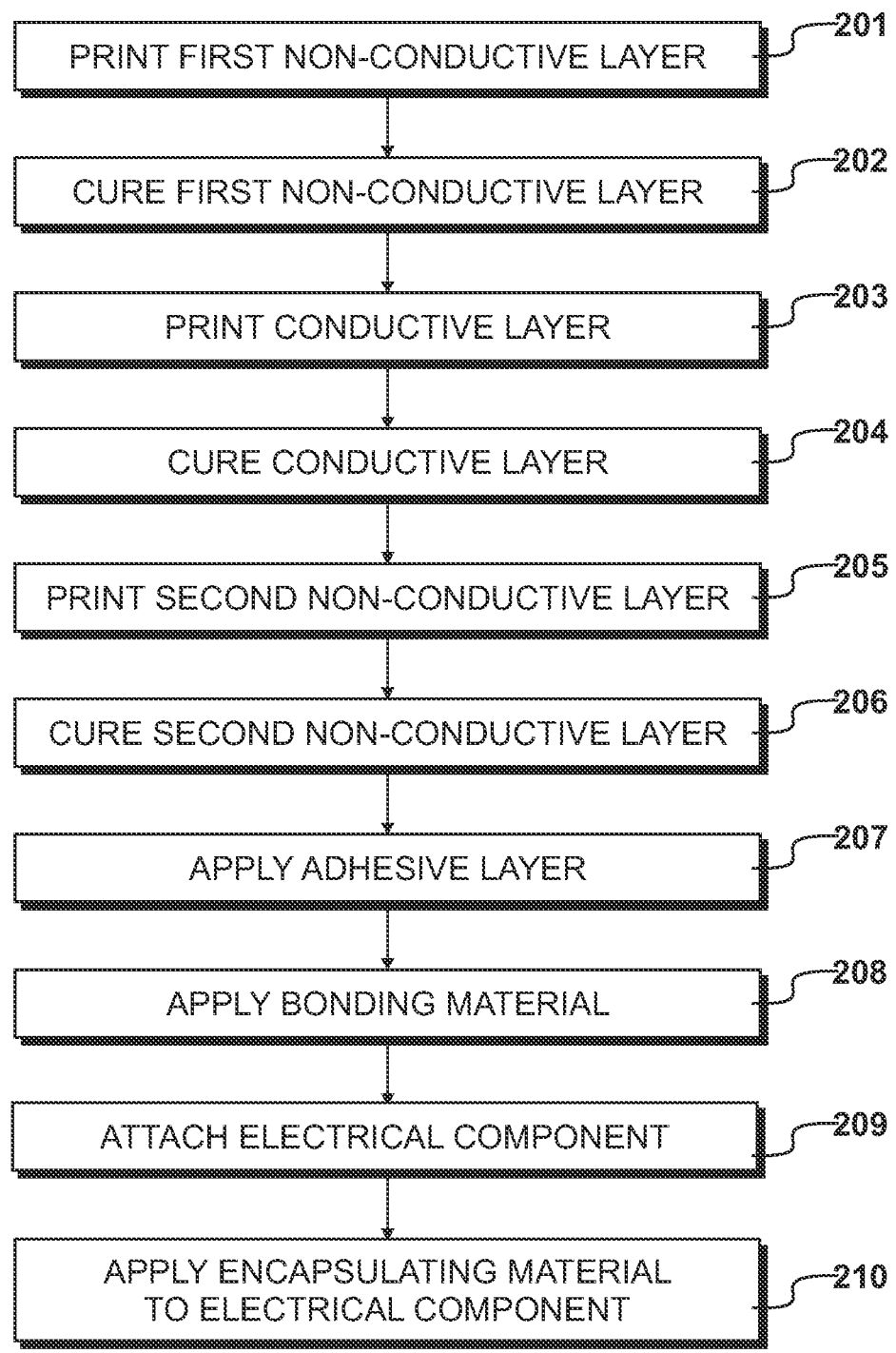
FIG. 2 shows a method of producing a conductive transfer.

A method of producing a conductive transfer suitable for the applications described in respect of FIG. 1 is illustrated diagrammatically in FIG. 2.

At step 201, a first non-conductive layer is printed using a conventional ink screen-printing process to create a suitable pattern such as that which will be described in respect of FIG. 3. In the embodiment, the first non-conductive layer is printed directly onto a substrate or transfer film. The first non-conductive layer is subsequently cured and dried at step 202 in anticipation of step 203.

At step 203, a first conductive layer is printed over the first non-conductive layer. This conductive layer will be described further with respect to FIG. 4 and comprises a power trace and a data trace.

The conductive layer is subsequently cured at step 204. At step 205, a second non-conductive layer is printed over the first conductive layer such that the first conductive layer is positioned between the first non-conductive layer and the second non-conductive layer. As will be explained further in respect of FIG. 5, openings may be included in the second non-conductive layer to coincide with the at least one electrical component. At step 206, the second non-conductive layer is cured by heating and/or drying.

At step 207, an adhesive layer is printed over the conductive and non-conductive layers to enable transfer of the conductive transfer to a surface or article such as a wearable item as previously described. The adhesive layer may also include corresponding openings to second non-conductive layer, again to coincide with the at least one electrical component. The adhesive layer may be cured following its application by means of an additional curing step as required.

Once the conductive transfer has been produced by means of steps 201 to 207, a bonding material is applied to the first conductive layer at step 208. The bonding material is applied such that the bonding material is in electrical contact with the first conductive layer. This can be achieved by suitable openings in the second non-conductive layer and the adhesive layer as described herein. At step 209, at least one electrical component is attached to the conductive transfer by placing the at least one electrical component in contact with the bonding material.

In an embodiment, the bonding material comprises a conductive adhesive comprising a resin and a metallic material such as silver. It is appreciated that other suitable conductive adhesives of alternative compositions may also be utilized. In an alternative embodiment, the bonding material comprises a solder paste. A suitable solder paste comprising metal alloys is a supplied as a low-temperature solder paste by Qualitek, Wirral, United Kingdom.

The bonding material can be applied in any suitable manner to the conductive layer. It is possible to hand-place a quantity of conductive adhesive onto the conductive layer. However, in order to ensure accurate placement of the electrical component, it is also suitable to utilize a pick-and-place machine to dispense the bonding material. The pick-and-place machine in this embodiment is supplied with a syringe containing the bonding material, and configured to dispense a predetermined quantity of the bonding material at a particular position on the conductive layer.

As an alternative, a method of stencil printing which comprises printing the bonding material through a stencil can be utilized. A printer is supplied with a metal stencil which provides openings where the bonding material is required. The printer passes across the stencil, which is loaded with bonding material, such that the bonding material is pushed through the stencil into the required position on the conductive layer. This is particularly suitable for more complex circuits which may require several points of application of bonding material for several different components, for example.

Once applied, the bonding material may then be cured. In the example utilizing solder paste as the bonding material, the transfer is placed into an oven known as a reflow oven. The metal in the solder paste melts and consequently secures the electrical component(s) into place before solidifying on cooling. In the conductive adhesive example, the conductive transfer may also be placed into an oven for curing.

In further embodiments, it is possible to utilize a combination of solder paste and conductive adhesive. In an example embodiment, the solder paste may be stencil printed and the conductive adhesive may be dispensed by the pick-and-place machine.

The electrical component can be attached to the conductive transfer by alternative means. In an embodiment, the step of attaching at least one electrical component comprises utilizing a pick-and-place machine to position the electrical component(s). Pick-and-place machines of this type function by having a plurality of components, typically supplied on a reel of tape, which are removed from the reel by means of a moveable head which is programmed to place the component on a particular part of the conductive transfer. In some embodiments, a plurality of moveable heads may be provided to enable more complex electrically functional conductive transfers to be manufactured.

The pick-and-place machine can be suitably aligned with the printed layers by ensuring that markers are printed onto the substrate or transfer film to which the pick-and-place machine can optically align using a vision system. This provides precise placement of the electrical components which is also repeatable, and consequently suitable for mass production.

In an alternative embodiment, the step of attaching at least one electrical component comprises a method known as stamp transfer printing. The electrical components are provided on a source material and a transfer stamp, made from an elastomer, is configured to select a plurality of components and place them onto the conductive transfer. The transfer stamp is cleaned and reset so the process can be repeated.

Prior to applying the bonding material and attaching the at least one electrical component, a further step may be included to electrically test the printed conductive layers to ensure their functionality. This process may also be conducted following placement of the electrical component to test the circuit, individual electrical components and the entire system.

In order to provide mechanical protection and strength, and also to protect the at least one electrical component such that the conductive transfer as a whole can be washed in line with conventional washing practices, at step 210, the at least one electrical component is encapsulated by applying an encapsulating material. The encapsulating material may comprise a resin-based material. This can be conducted by utilizing a dispensing syringe in a similar manner to the dispensing of the bonding material as previously described, or alternatively by means of screen printing or stencil printing.

In an alternative embodiment, the encapsulation can be achieved by utilizing a conformal coating machine which are conventionally used to spray coatings onto electrical circuitry. The encapsulating material may be any conventional conformal coating material with required properties for the application in question. For example, such a coating may include particular heat conductive properties so as to disperse or direct heat towards the electrical component. It is appreciated that following the application of the encapsulating material, a further curing step of the encapsulating material may be performed.

In each of the printing processes, it is appreciated that the printing may be conducted by any conventional printing process. In addition to screen-printing therefore, any one of the printing steps may comprise gravure printing, inkjet printing, laser printing, lithographic printing or any other suitable method.

FIG. 3

Further details regarding the printed layers of the conductive transfer will now be described with respect to FIGS. 3 to 6 of the application.

Figure 3:
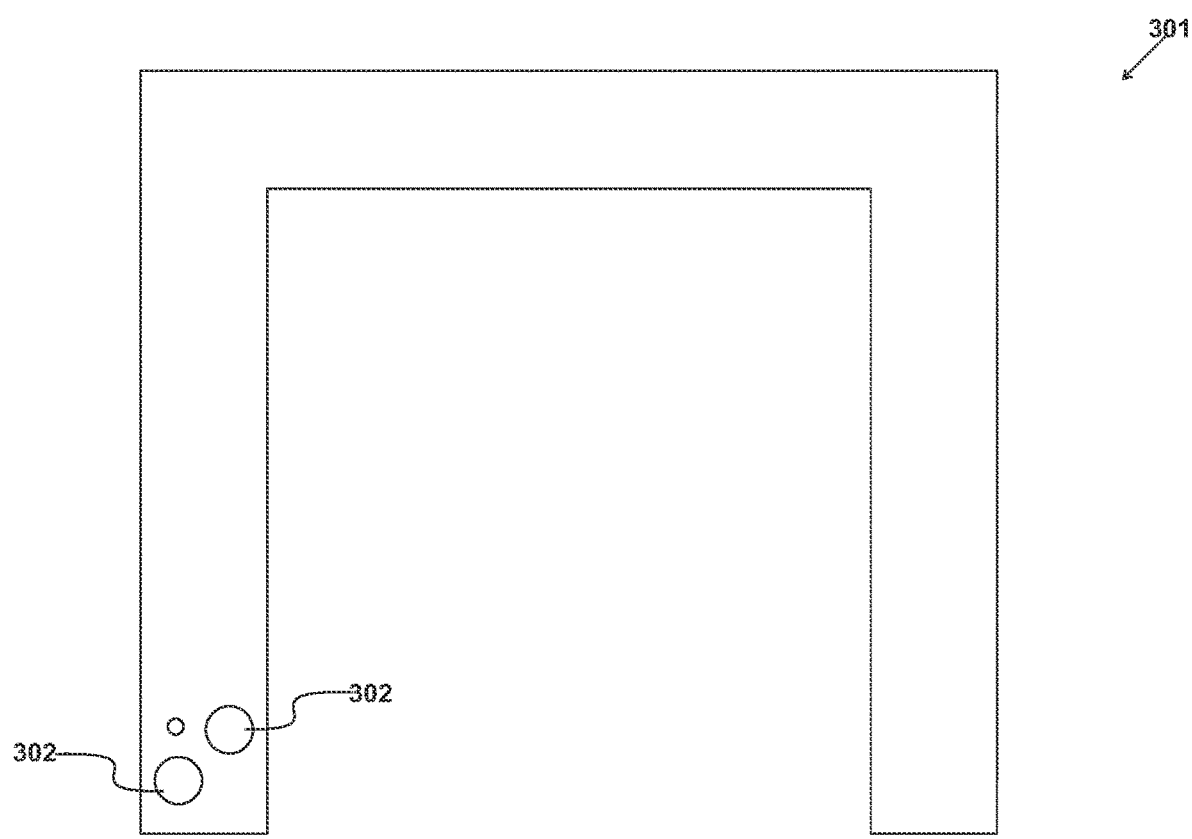
FIG. 3 shows a first non-conductive layer of a conductive transfer of the present invention.

An example pattern of the first non-conductive layer in line with the example shown in FIG. 1 is shown in FIG. 3. First non-conductive layer 301 is printed directly onto a substrate, which is typically in the form of a transfer film. Non-conductive layer 301 comprises a suitable printing ink which comprises a water-based printing ink, an ultraviolet cured printing ink, a silicone ink, a solvent based ink, a latex printing ink or any other suitable printing ink.

First non-conductive layer 301 presents a solid layer with openings 302 which, when the conductive transfer is completed, provide suitable access to the conductive layer so that an external electrical connection can be made.

FIG. 4

Figure 4:
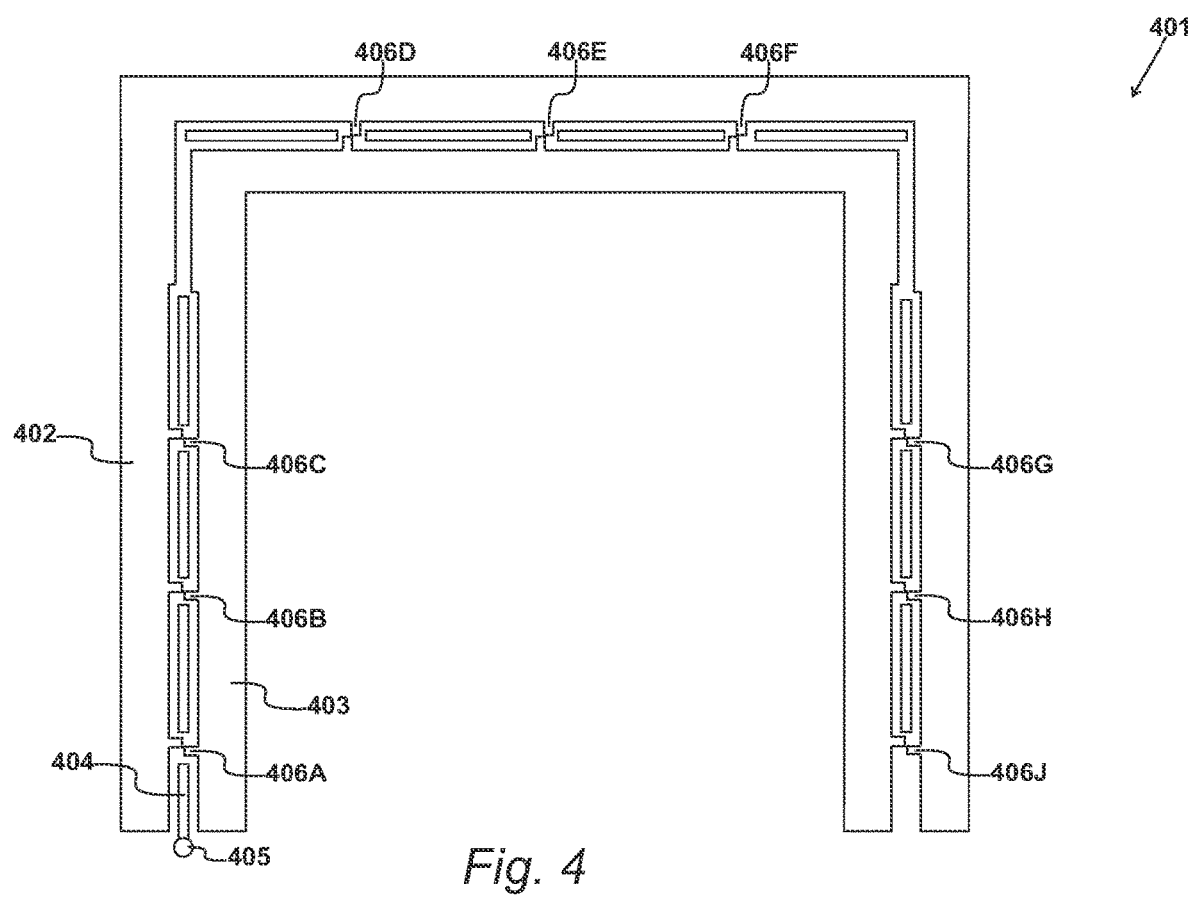
FIG. 4 shows a conductive layer of a conductive transfer of the present invention.

A corresponding example pattern to FIG. 3 of the conductive layer is shown in FIG. 4. Conductive layer 401 is printed over first non-conductive layer 301 as described in FIG. 2.

Conductive layer 401 comprises an electrically conductive ink comprising a metallic material. In the embodiment the electrically conductive ink comprises silver.

In the embodiment, conductive layer 401 comprises three separate traces. Traces 402 and 403 are configured to be power traces to enable power to be provided to an electrical component. A further trace 404 comprises a data trace for providing an electrical component with an electrical signal. Each trace 402, 403 and 404, lead to a connection point 405 which terminates at driving controller 104 shown in FIG. 1. Thus, the driving controller 104 can provide power to each of the power traces 402 and 403 via connection point 405 and electrical signals to data trace 404.

In the embodiment, a voltage of zero volts (0V) is supplied to power trace 402 and a voltage of five volts (5V) is supplied to power trace 403 to ground. Data trace 404 is positioned central to each of the power traces and connects electrically to the power traces at points at which electrical components are to be attached so as to enable a voltage to be supplied to each of the electrical components. In the embodiment, conductive layer 401 is configured to receive nine (9) electrical components at each attachment point 406.

In the embodiment, the nine (9) electrical components comprise an illuminating device as will be described further with respect to FIG. 7. In the embodiment, the illuminating devices are LEDs which are configured to receive an electrical signal from data trace 404 when in operation.

In an embodiment, conductive layer 401 comprises an antenna and is configured to provide a connection to one or more of the at least one electrical component. In a further embodiment, conductive layer 401 is printed as a touch sensor connectable to a touch controller. It is appreciated that these examples are not exhaustive and the conductive layer may be utilized in any suitable manner to provide an electrical circuit.

FIG. 5

Figure 5:
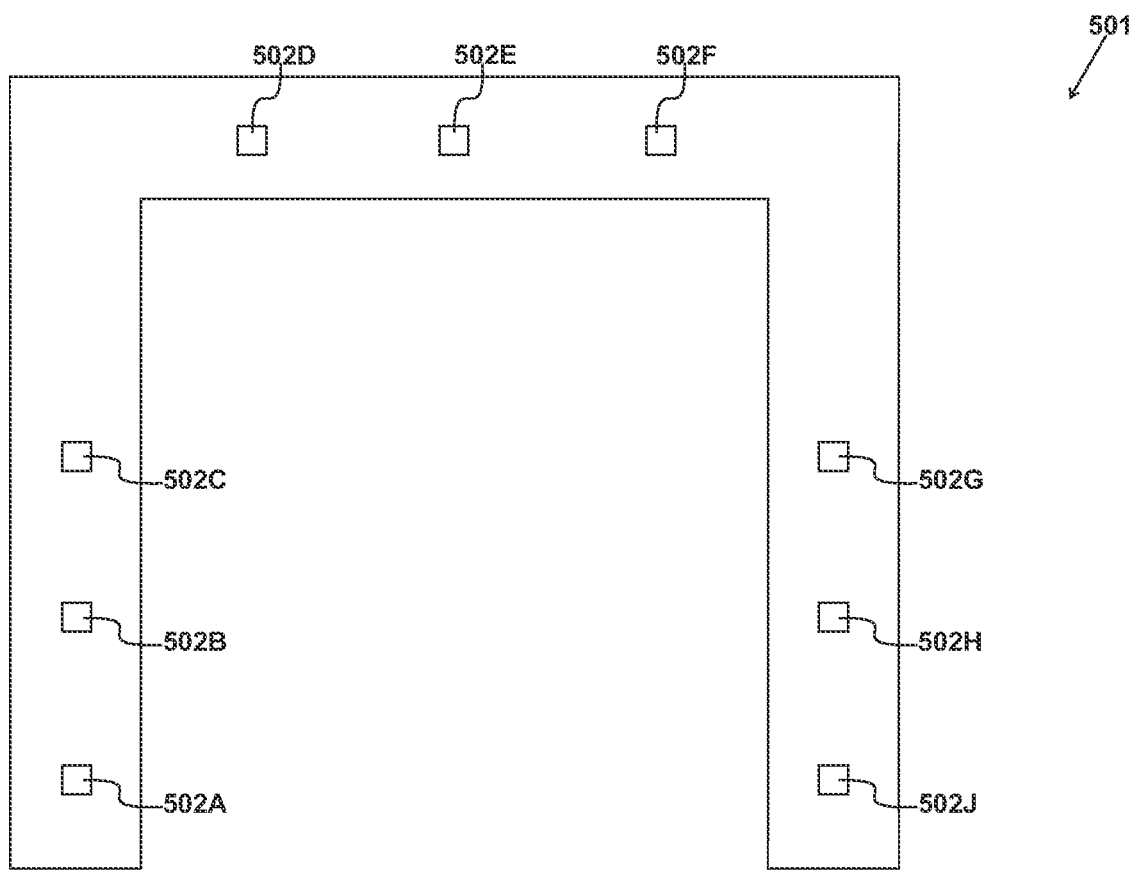
FIG. 5 shows a second non-conductive layer of a conductive transfer of the present invention.

A further corresponding example pattern for the second non-conductive layer of the conductive transfer is shown in FIG. 5. Second non-conductive layer 501 comprises a suitable printing ink which comprises a water-based printing ink, an ultraviolet cured printing ink, a silicone ink, a solvent based ink, a latex printing ink or any other suitable printing ink. It is anticipated that the printing ink of second non-conductive layer 501 is substantially similar to the printing ink of first non-conductive layer 301.

In the embodiment, non-conductive layer 501 comprises a plurality of openings 502 which correspond to the attachment points 406 where electrical components have been attached in the process. Thus, in this way, the electrical components are not printed over by non-conductive layer 501, and protrude through non-conductive layer 501.

FIG. 6

Figure 6:
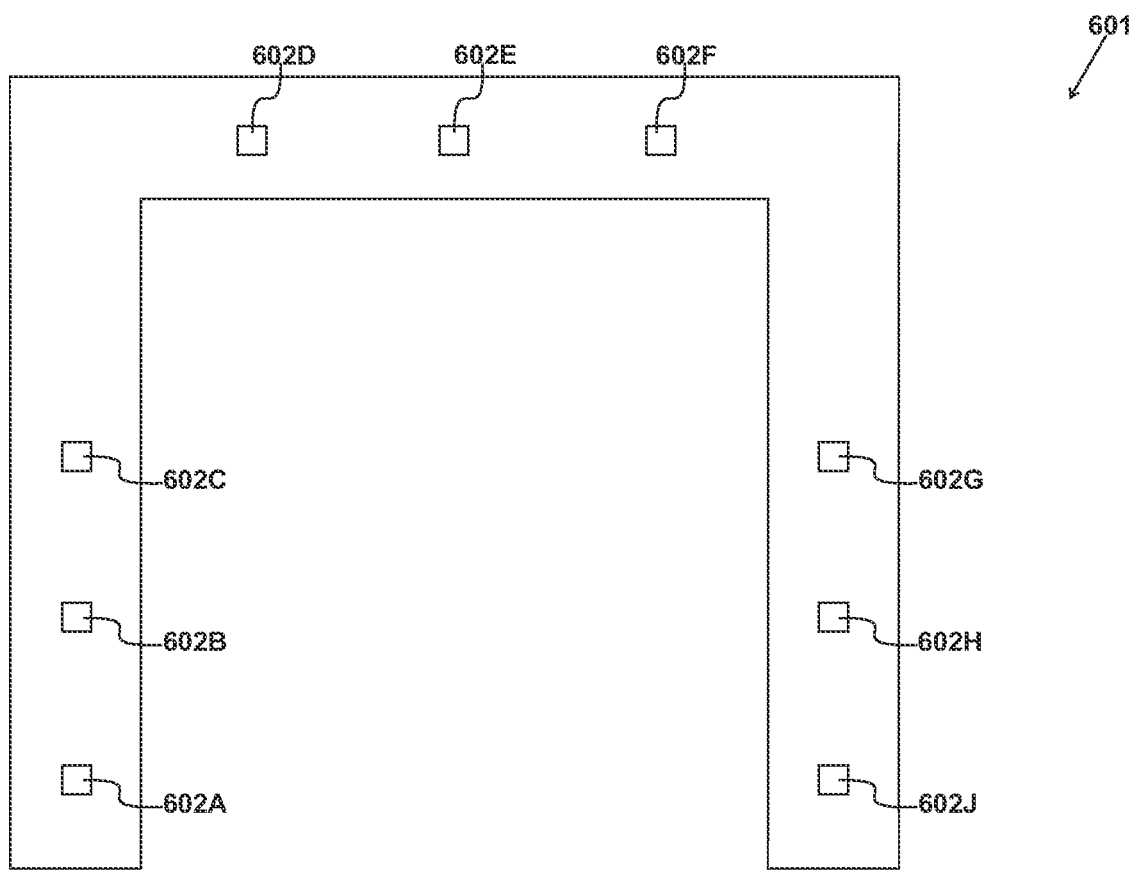
FIG. 6 shows an adhesive layer of a conductive transfer of the present invention.

A corresponding pattern for adhesive layer 601 is shown in FIG. 6. Adhesive layer 601 is substantially similar in terms of its pattern to second non-conductive layer 501. Thus, in a similar way, a plurality of openings 602 are included in the adhesive layer such that the electrical components are not obscured or covered by the adhesive layer.

Adhesive layer 601 is suitable for adhering the conductive transfer to any suitable surface or article such as the wearable item described in FIG. 1. Adhesive layer 601 comprises a water-based adhesive, a solvent based adhesive, a printable adhesive, a powder adhesive or any other suitable adhesive which is capable of adhering conductive transfer to a surface or article.

It is appreciated that, any one or all of the layers described in respect of FIGS. 3 to 6 comprise, in an embodiment, stretchable inks enabling the conductive transfer to be stretchable once produced. In addition, conductive layer 401 may be printed sinusoidally to provide increased stretchability if required.

FIG. 7

Figure 7:
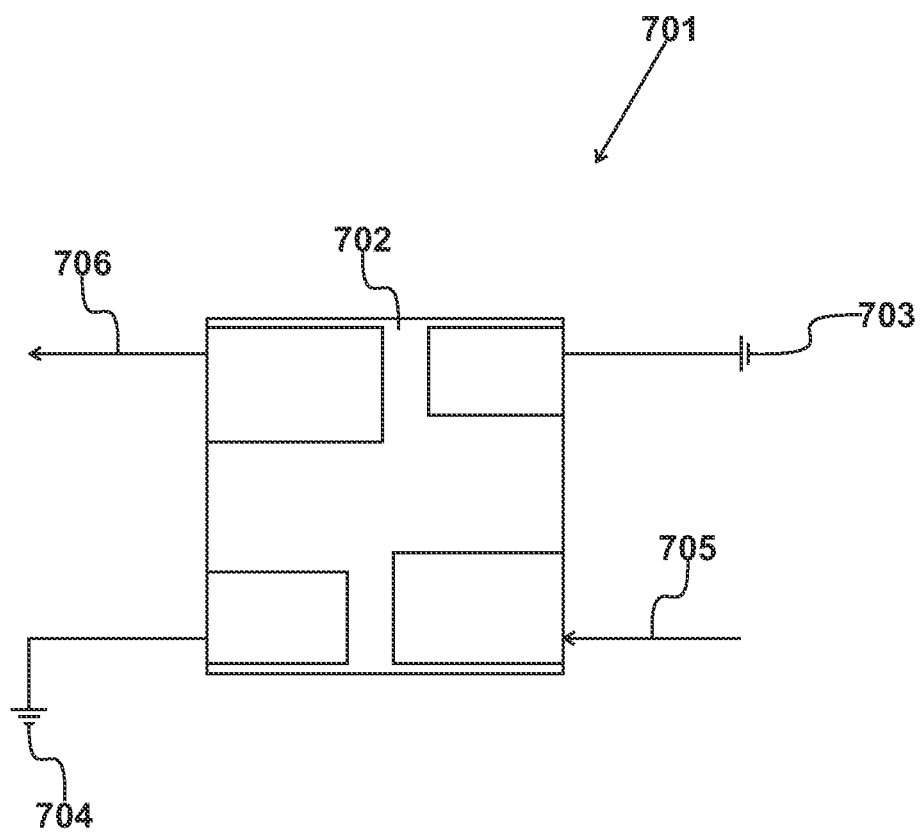
FIG. 7 shows a schematic view of an example electrical component in the form of an illuminating device.

A suitable electrical component for use in accordance with the present invention is shown in FIG. 7. A schematic illustration of an illuminating device 701 is shown. In the embodiment, illuminating device 701 comprises an integrated LED chip such as those available from Dongguang Opsco Optoelectronics Co., Ltd., China.

Illuminating device 701 comprises a housing 702 which comprises a plurality of LEDs and a controller. In the embodiment, the housing comprises three LEDs which are each a different color, red, green and blue. Illuminating device 701 includes four electrodes for electrical connection. One electrode provides a power source 703 to the controller and LEDs. A further electrode is grounded 704. The remaining two electrodes are configured to receive a control signal input 705 and provide a control signal output 706.

When attached to conductive layer 401, power trace 403 provides a connection to power source 703 and power trace 402 provides a connection to ground 704. Data trace 404 provides an electrical signal which travels along data trace and provides an indication of an operating configuration such as the nature of the LEDs as being off or on or their output intensity. In the embodiment, the electrical signal is provided as a modulated waveform. Each LED is configured to receive eight bits (8b) of data from the signal with twenty-four bits (24b) being received per illuminating device. The controller in each illuminating device therefore controls the amount of data received to ensure the LEDs are illuminated as required.

Thus, once attached to conductive layer 401, in use, the electrical signal is sent to a first illuminating device, for example 406A, which receives twenty-four bits (24b) from the data trace, before the next twenty-four bits (24b) are provided to the next illuminating device, 406B.

FIG. 8

Figure 8:
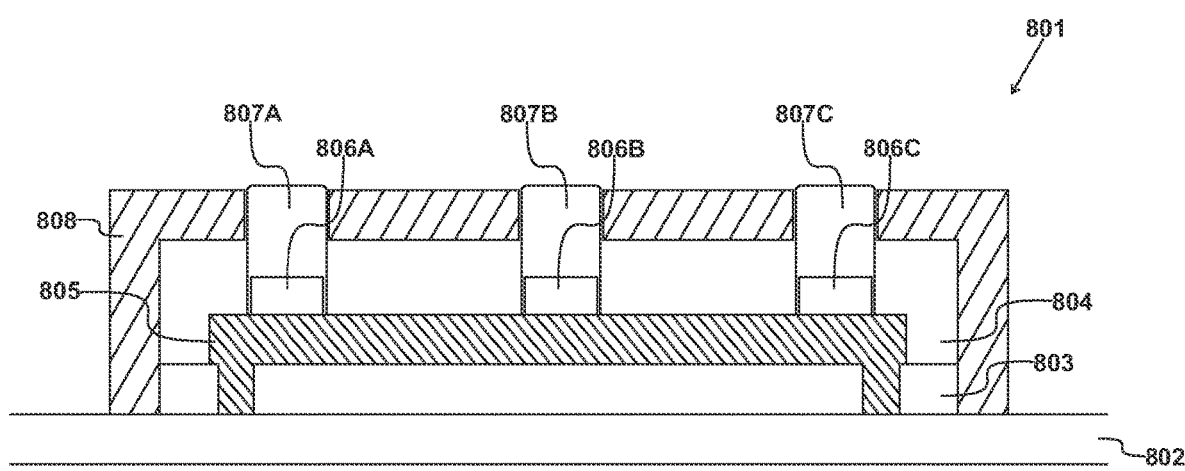
FIG. 8 shows a schematic cross-sectional view of a conductive transfer.

A schematic cross-sectional view of a conductive transfer 801 in accordance with the present invention is shown in FIG. 8. It is appreciated that the view is for diagrammatic purposes only and not to scale.

Conductive transfer 801 comprises a substrate 802 onto which the non-conductive layers and conductive layers are printed in line with the process previously described herein. In the embodiment, substrate 802 is a polyester film. In an alternative embodiment, substrate 802 comprises a paper film, coated paper or thermoplastic polyurethane (TPU).

Conductive transfer 801 further comprises first non-conductive layer 803, second non-conductive layer 804 and first conductive layer 805 between first non-conductive layer 803 and second non-conductive layer 804. From the cross-sectional view shown, it can be seen that conductive transfer 801 comprises a plurality of electrical components 806, with three across this particular cross-section. As described previously, conductive layer 805 comprises a power trace and a data trace for providing a power source and an electrical signal to each of the electrical components as necessary. Thus, each electrical component is in electrical communication with conductive layer 805.

In the embodiment, conductive transfer 801 further comprises an encapsulating material 807 which protects each of the electrical components such as from debris, dirt, fluid or moisture. Each part of the encapsulating material 807 is configured to encapsulate each electrical component. Conductive transfer 801 further comprises an adhesive layer 808 which is utilized for attaching conductive transfer 801 to a surface or article.

It is appreciated that, the embodiment shown herein is suitable for the application as described in FIG. 1. However, it is further appreciated that, in alternative embodiments, the layers of the conductive transfer could be reversed to account for the directionality of alternative electrical components. This can be achieved by transferring the whole conductive transfer onto a further substrate and utilizing a further adhesive that is responsive to ultraviolet light.

FIG. 9

Figure 9:
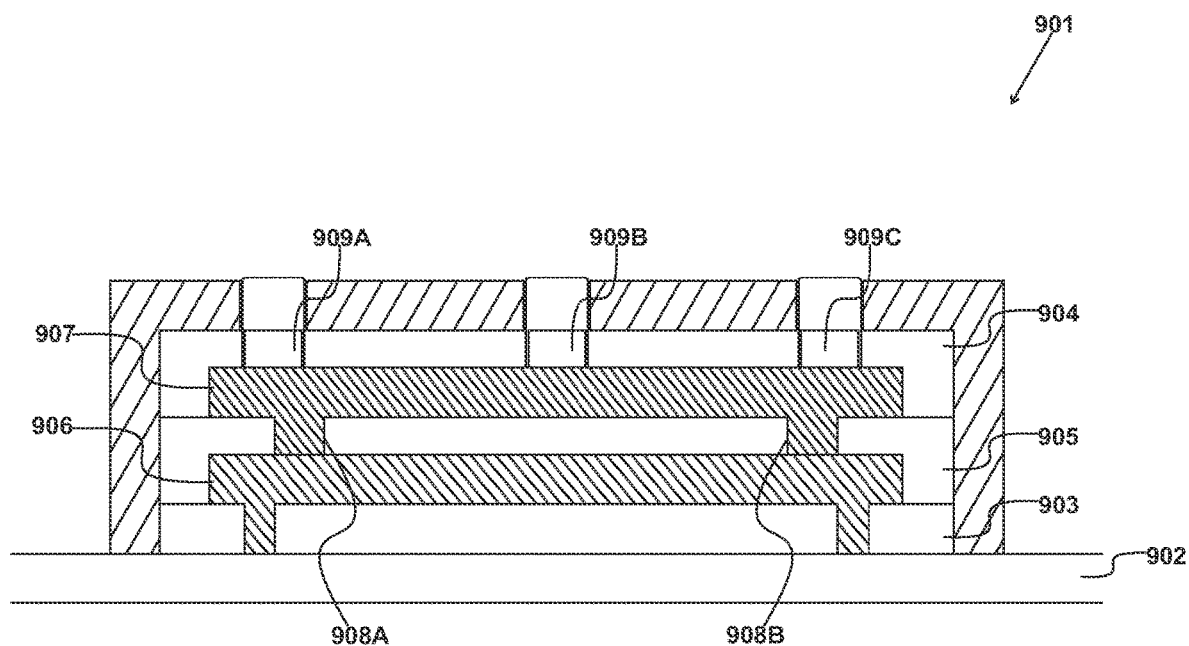
FIG. 9 shows schematic cross-sectional view of an alternative conductive transfer having a plurality of conductive layers.

A schematic cross-sectional view of a conductive transfer 901 in another embodiment in accordance with the present invention is shown in FIG. 9. It is appreciated that the view is for diagrammatic purposes only and not to scale.

Conductive transfer 901 comprises a substrate 902 which is substantially similar to substrate 802 of conductive transfer 801. Thus, substrate 902 may be a suitable polyester film, a paper film, coated paper or thermoplastic polyurethane (TPU).

Conductive transfer 901 further comprises first non-conductive layer 903, second non-conductive layer 904 and third non-conductive layer 905. Conductive transfer 901 also includes a first conductive layer 906 positioned between first non-conductive layer 903 and third non-conductive layer 905 and a second conductive layer 907 positioned between second non-conductive layer 904 and third non-conductive layer 905.

Second conductive layer 907 forms an electrical connection with first conductive layer 906. Third non-conductive layer 905 comprises an electrical pathway or via to provide the electrical connection, and in the embodiment, the electrical pathway comprises two openings 908 in third non-conductive layer 905. Thus, when third non-conductive layer 905 is printed, it is printed in such a way that openings 908 are present and the pattern printed is broken. Thus, when conductive layer 907 is overprinted in line with the process described herein, the conductive ink of conductive layer 907 prints into the openings 908 thereby forming the electrical pathway and connection.

Conductive transfer 901 also comprises a plurality of electrical components 909, with three shown across this particular cross-section.

In accordance with the invention, each electrical component is in electrical communication with at least one of conductive layers 906 and 907 and at least one of the conductive layers provides a power trace and data trace to communicate with the electrical components as necessary.

It is appreciated that, while the example of FIG. 9 shows two conductive layers, any other number of conductive layers and combination of conductive layers and non-conductive layers may be utilized so as to create electrical devices of increased complexity. This provides a cheaper and easier alternative to conventional PCBs which may include a plurality of similar layers with increased functionality, but which require significant post processing to include vias similar to the conductive pathway of FIG. 9. In particular, this process in regard to the conductive transfer can be easily included without substantial addition to the process.

FIG. 10

Figure 10:
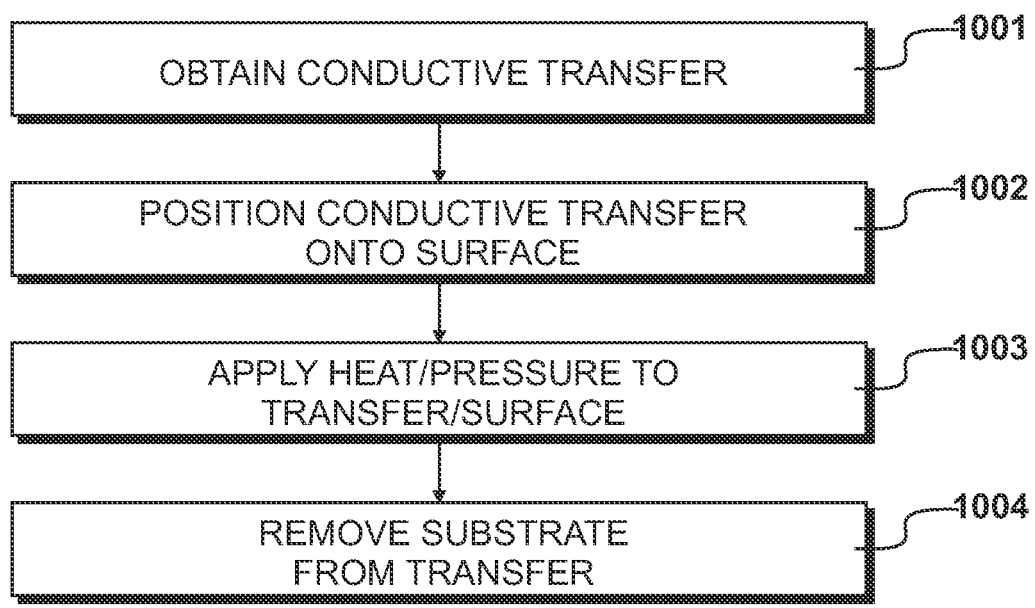
FIG. 10 shows the process of applying a conductive transfer to a surface or an article.

Following the production of the conductive transfer as described herein, the conductive transfer can be applied to a surface of an article such as the wearable item described in respect of FIG. 1. FIG. 10 illustrates the process of applying a conductive transfer to a surface of an article.

At step 1001 a conductive transfer is obtained before being positioned in a suitable location on a surface to which the conductive transfer can be applied at step 1002.

Once the conductive transfer is in position, heat, pressure, or a combination of heat and pressure is applied to both the transfer and the surface at step 1003. This allows the conductive transfer to adhere to the surface due to the adhesive layer of the conductive transfer.

In the embodiment, heat and pressure is applied by means of a heat press. Conventional heat presses typically comprise a rigid surface onto which the pressing is affected. This presents a problem in that damage can be caused to the electrical components on conventional machines. In one embodiment, an air-filled pad is supplied underneath the press such that, when the electrical components impact the air-filled pad they are not damaged. In an alternative embodiment, the heat press is supplied with a stencil which aligns with the at least one electrical component such that, when the force from the heat press is applied, the electrical components do not receive the force while the rest of the conductive transfer does. This can also work to protect the electrical components from heat as necessary.

Once adhered, the article now comprising the conductive transfer can be removed from the machine for applying heat and/pressure with the transfer now attached. The substrate onto which the non-conductive and conductive inks are printed can then be removed from the conductive transfer at step 1004 such that the article retains the conductive transfer and electrical components therein.

It is appreciated that, prior to the application of the transfer to a surface or an article, the electrical components and conductive transfer may be suitably tested for functionality to ensure they are working effectively. This allows for fully functioning conductive transfers to be provided to third parties for their own application to articles as necessary. However, it is further appreciated that further testing may also take place after the application stages to ensure the functionality of the conductive transfer following application.

Thus, the present invention allows for a transfer with increased functionality which can be applied to any suitable article having a surface and provides an electrically conductive circuit within the article with functions with an integral electrical component. The conductive transfer also retains the durability required to be able to withstand conventional cleaning or washing processes.

The invention claimed is:

1. A conductive transfer, comprising:
   a first non-conductive layer and a second non-conductive layer, said second non-conductive layer comprising a first plurality of openings;
   a first conductive layer between said first non-conductive layer and said second non-conductive layer;
   an adhesive layer for enabling transfer of said conductive transfer to a surface or an article, said adhesive layer comprising a second plurality of openings which coincide with said first plurality of openings;
   a bonding material in electrical contact with said first conductive layer by means of said first plurality of openings and said second plurality of openings; and
   at least one electrical component in electrical communication with said first conductive layer and said bonding material; wherein:
   said first conductive layer comprises a power trace for providing a power source to said at least one electrical component and a data trace for providing said at least one electrical component with an electrical signal; and
   said at least one electrical component is encapsulated by an encapsulating material.

2. A conductive transfer according to claim 1, wherein said electrical signal indicates an operating configuration.

3. A conductive transfer according to claim 1, wherein said electrical signal is provided as a modulated waveform.

4. A conductive transfer according to claim 1, wherein said at least one electrical component comprises a sensing device and is configured to measure any one of the following:
   temperature; heat flow; light; sound; touch; biomedical data; physiological data; environmental conditions; electromagnetic waves.

5. A conductive transfer according to claim 1, wherein said conductive transfer is incorporated into a wearable item and said at least one electrical component is configured to provide stimulation to a person wearing said wearable item.

6. A conductive transfer according to claim 1, wherein said conductive transfer is incorporated into a wearable item and said conductive transfer is in electrical communication with a driving controller and said driving controller is incorporated into said wearable item.

7. A conductive transfer according to claim 1, wherein said first conductive layer comprises an antenna.

8. A conductive transfer according to claim 1, further comprising a third non-conductive layer and a second conductive layer, wherein said second conductive layer forms an electrical connection with said first conductive layer and said third non-conductive layer comprises an electrical pathway to provide said electrical connection.

9. A conductive transfer according to claim 1, wherein said at least one electrical component comprises any one of the following:
an illuminating device; a controller; a wireless enabled integrated circuit.

10. A conductive transfer according to claim 1, wherein said at least one electrical component is configured to provide near-field communication.

11. A conductive transfer according to claim 1, wherein any one of said at least one electrical component comprises a printed component.

12. A method of producing a conductive transfer, comprising the steps of:
printing a first non-conductive layer;
printing a first conductive layer over said first non-conductive layer, said first conductive layer comprising a power trace and a data trace;
printing a second non-conductive layer over said first conductive layer such that said first conductive layer is positioned between said first non-conductive layer and said second non-conductive layer, said second non-conductive layer comprising a first plurality of openings;
printing an adhesive layer over said first conductive layer and said first and second non-conductive layers to enable transfer of the conductive transfer to a surface or article, said adhesive layer comprising a second plurality of openings which coincide with said first plurality of openings;
applying a bonding material to said first conductive layer by means of said first plurality of openings and said second plurality of openings such that said bonding material is in electrical contact with said first conductive layer;
attaching at least one electrical component by placing said at least one electrical component in contact with said bonding material; and
encapsulating said at least one electrical component by applying an encapsulating material.

13. A method of producing a conductive transfer according to claim 12, wherein said step of attaching at least one electrical component comprises utilizing a pick-and-place machine to position said at least one electrical component.

14. A method of producing a conductive transfer according to claim 12, wherein said step of attaching at least one electrical component comprises stamp transfer printing said at least one electrical component.

15. A method of producing a conductive transfer according to claim 12, wherein said step of applying a bonding material comprises utilizing a pick-and-place machine to dispense said bonding material.

16. A method of producing a conductive transfer according to claim 12, wherein said step of applying a bonding material comprises the step of:
printing said bonding material through a stencil.

17. A method of producing a conductive transfer according to claim 12, wherein said bonding material comprises any one of the following:
a conductive adhesive; a solder paste.

18. A method of producing a conductive transfer according to claim 12, wherein said bonding material comprises a solder paste, said method further comprising the step of:
curing said conductive transfer in an oven so as to melt said solder paste to secure said at least one electrical component to said conductive transfer.

19. A method of producing a conductive transfer according to claim 12, wherein any one of said steps of printing comprises any one of the following:
screen-printing; gravure printing; inkjet printing; laser printing; lithographic printing.

20. A method of producing a conductive transfer according to claim 12, further comprising the step of:
electrically testing said first conductive layer prior to said step of attaching said at least one electrical component.

* * * * *